United States Patent
Iguchi et al.

(10) Patent No.: US 7,795,667 B2
(45) Date of Patent: Sep. 14, 2010

(54) SEMICONDUCTOR MEMORY PREVENTING AN ELECTRIC SHORT CIRCUIT BETWEEN A WORD LINE AND A SEMICONDUCTOR SUBSTRATE, AND MANUFACTURING METHOD FOR THE SEMICONDUCTOR MEMORY

(75) Inventors: Tadashi Iguchi, Mie-ken (JP); Katsuhiro Ishida, Mie-ken (JP); Hiroaki Tsunoda, Mie-ken (JP); Hirohisa Iizuka, Mie-ken (JP); Hiroaki Hazama, Tokyo (JP); Seiichi Mori, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 10/612,033

(22) Filed: Jul. 3, 2003

(65) Prior Publication Data

US 2004/0099900 A1 May 27, 2004

(30) Foreign Application Priority Data

Nov. 21, 2002 (JP) ............................ P2002-338452

(51) Int. Cl.
*H01L 27/115* (2006.01)
*H01L 21/336* (2006.01)

(52) U.S. Cl. ............................... 257/316; 257/E21.681; 257/E27.103; 438/257

(58) Field of Classification Search ................. 257/314, 257/315, 316, 317, 318, 319, 320, 321, 322, 257/323, 324, 325, 326, E21.68–E21.694, 257/E27.102–E27.104; 438/201, 211, 216, 438/241, 257, 258, 260, 261, 262, 263, 264, 438/266, 591, 593, 594
See application file for complete search history.

(56) References Cited

U.S. PATENT DOCUMENTS 5,949,101 A * 9/1999 Aritome (Continued)

FOREIGN PATENT DOCUMENTS

JP 08-125148 5/1996

(Continued)

OTHER PUBLICATIONS

Notification of Reasons for Refusal issued by the Japanese Patent Office on Oct. 31, 2006, for Japanese Patent Application No. 2002-338452, and English-language translation thereof.

(Continued)

*Primary Examiner*—Sue Purvis
*Assistant Examiner*—Kevin Quinto
(74) *Attorney, Agent, or Firm*—Finnegan, Henderson, Farabow, Garrett & Dunner, L.L.P.

(57) ABSTRACT

A semiconductor device comprises a non-volatile memory including a memory cell array, element isolating regions, a second trench and a word line. The memory cell array is constituted by memory cells which have floating electrodes and are arranged in the shape of a matrix on a semiconductor substrate. Each of the element isolating regions has a first trench formed in the semiconductor substrate and between memory cells adjacent to each other along a gate width direction, and an isolating filler filled in the first trench. The second trench is formed in the isolating filler and between the floating electrodes of the memory cells adjacent to each other along the gate width direction, and is narrow at the bottom thereof. The word line is connected to the memory cells, buried in the second trenches and extending along the gate width direction.

10 Claims, 13 Drawing Sheets

U.S. PATENT DOCUMENTS

2002/0179962 A1* 12/2002 Kinoshita .................. 257/315

FOREIGN PATENT DOCUMENTS

| JP | 11-177066 | 7/1999 |
| JP | 11 317464 | 11/1999 |
| JP | 2000-12709 | 1/2000 |
| JP | 2000-174145 | 6/2000 |
| JP | 2001-274367 | * 10/2001 |
| JP | 2002-076299 | 3/2002 |
| JP | 2002-083884 | * 3/2002 |

OTHER PUBLICATIONS

Notification of Reasons for Refusal dated Feb. 8, 2005, issued by the Japanese Patent Office in counterpart Japanese Application No. 2002-338452.

Notification of Reasons for Refusal issued by the Japanese Patent Office on Mar. 30, 2010, for Japanese Patent Application No. 2006-356265, and English-language translation thereof.

* cited by examiner

PRIOR ART

SEMICONDUCTOR MEMORY PREVENTING AN ELECTRIC SHORT CIRCUIT BETWEEN A WORD LINE AND A SEMICONDUCTOR SUBSTRATE, AND MANUFACTURING METHOD FOR THE SEMICONDUCTOR MEMORY

CROSS REFERENCE TO RELATED APPLICATION

This application is based upon and claims the benefit of priority from the prior Japanese Patent Application No. 2002-338452, filed on Nov. 21, 2002, the entire contents of which is incorporated herein by reference.

FIELD OF THE INVENTION

This invention relates to a semiconductor device and a method of manufacturing the same, and more particularly to a semiconductor device including a non-volatile memory and a method of manufacturing the same.

DESCRIPTION OF THE RELATED ART

FIG. 21 of the accompanying drawings is a cross section of a NAND type electrically erasable programmable read only memory (called "EEPROM" hereinafter), taken along an extending direction of a word line in a memory cell array. The NAND type EEPROM comprises a silicon single crystal semiconductor substrate 100, a plurality of memory cells M arranged in the shape of a matrix, and element isolating regions 110 provided between the memory cells M.

Each memory cell M is constituted by a single transistor which includes: a gate insulating film 120 on a well region 101 of the semiconductor substrate 100; a floating gate electrode 121 on the gate insulating film 120; a gate insulating film 122 on the floating gate electrode 121; a control gate electrode 123 on the gate insulating film 122; and source and drain regions, not shown. The gate insulating film 120 functions as a tunnel insulating film. The source and drain regions are vertically arranged on the plane of the drawing (i.e. along a gate length direction or an extending direction of a bit line), and are integral with drain and source regions of other memory cells M adjacent along the gate length direction.

The control gate electrode 123 serves for memory cells M adjacent to one another along the extending direction of the word line (i.e. along a gate width direction), thereby forming a word line 123 WL, on which bit lines 130 are provided. A plurality of memory cells M, e.g. eight (8-bit) or sixteen (16-bit) memory cells, constitute a memory cell unit. Each bit line 130 is connected to each memory cell unit via a unit selecting transistor (not shown).

The element isolating region 110 generally has the shallow trench isolation (STI) structure, and includes a trench 111 in a well region 101 (of the semiconductor substrate 100), and a silicon oxide film 112 filled in the trench 111. The trench 111 extends from a surface of the well region 101 (or the semiconductor substrate 100) toward a bottom of the well region 101. With the STI structure, the element isolating region 110 can be made small compared with that formed by the selective oxidation, for example. This is effective in realizing microfabrication and increasing a storage capacity.

Further, a trench 115 having a uniform diameter (a trench width) is made in the silicon oxide film 112 of the element isolating region 110. An insulating film 112A which is in the same level with the insulating film 112 is present on an inner surface of the trench 115. A part of the word line 123WL is buried in the trench 115 via the insulating film 112A.

The trench 115 is made as described hereinafter (refer to FIG. 21).

(1) First of all, the element isolating region 110 is formed in the main surface of the well region 101. Further, the gate insulation film 120 is formed on the well region 101 at a position for memory cells M, in a manner substantially identical to that for the element isolating region 110, so that a first silicon polycrystalline film (a lower part of the floating gate electrode 121) is formed on the gate insulating film 120.

(2) A second silicon polycrystalline film (an upper part of the floating electrode 121) is formed on the first silicon polycrystalline film. An etching mask is made on the second silicon polycrystalline film by the photolithography. The second and first silicon polycrystalline films are dry-etched and patterned using the etching mask in order to make the floating gate electrode 121. The etching mask is aligned to the element isolating region 110, so that the opposite ends of the floating gate electrode 121 overlap on the element isolating region 110.

(3) The silicon oxide film 112 on the element isolating region 110 is dry etched using the floating gate electrode 121 as an etching mask, thereby making the trench 115, i.e. the trench 115 is self-aligned to the floating gate electrode 121.

(4) The gate insulating film 122 is formed on the floating gate electrode 121, and the insulating film 122A is also formed on the inner surface of the trench 115.

(5) The control gate electrode 123 is formed on the gate insulating film 122, thereby completing the memory cell M. The word line 123WL extending along the gate width direction is also made together with the control gate electrode 123. The word line 123WL has its the part embedded in the trench 115 via the insulating film 122A.

Parasitic capacitance C1 is normally generated between memory cells M (specifically between the floating gate electrodes 121). Further, parasitic capacitance C2 is generated at a floating gate electrode 121, at a dielectric constituted by the silicon oxide film 112 and an insulating film 122A of the trench 115, and at the word line 123WL in the trench 115. The parasitic capacitance C2 is electrically connected in parallel to the parasitic capacitance C1, so that the trench 115 reduces a total of parasitic capacitances produced between the memory cells M. Therefore, it is possible to prevent erroneous data writing in non-selected memory cells M which are adjacent to selected memory cells M, thereby improving operation performance of the NAND type EEPROMs.

NAND type EEPROMs of the foregoing kind are described in Japanese Patent Laid-Open Publications No. 2000-174145 and No. 2002-083884. However, such NAND type EEPROMs seem to suffer from the following problems.

(1) When manufacturing the foregoing NAND type EEPROM, the floating gate electrode 121 is often misaligned from the element isolating region 110. Since the floating gate electrode 121 is used as the etching mask (i.e. an etching mask for patterning the floating gate electrodes 121 is actually used), the trench 115 is misaligned from the element isolating region 110. As a result, a distance L1 between the trench 115 and the well region 101 is increased while a distance L2 between the trench 115 and the well region 101 is reduced (see FIG. 21). Insulation resistances tend to be reduced at L1 and L2. For instance, a high writing voltage, e.g. 24V, is applied to the word line 123WL at the time of data writing (or data erasing), so that there is electric short-circuiting between the word line 123WL and the well region 101. This will reduce the electric reliability of the NAND type EEPROMs.

(2) The trench 115 with a uniform diameter has a sharp bottom edge C as shown in FIG. 21. An electric field tends to gather at the sharp bottom edge C, which causes electric short-circuiting between the word line 123WL and the well region 101, and reduces the electric reliability of the NAND type EEPROM.

BRIEF SUMMARY OF THE INVENTION

According to a first aspect of the embodiment of the invention, there is provided a semiconductor device comprising a non-volatile memory. The non-volatile memory includes: a memory cell array constituted by memory cells which have floating electrodes and are arranged in the shape of a matrix on a semiconductor substrate; element isolating regions, each of which has a first trench formed in the semiconductor substrate and between the memory cells adjacent to each other along a gate width direction, and an isolating filler filled in the first trench; a second trench formed in the isolating filler and between the floating electrodes of the memory cells adjacent to each other along the gate width direction and being narrow at the bottom thereof; and a word line connected to the memory cells, embedded in the second trenches and extending along the gate width direction.

In accordance with a second aspect, the embodiment of the invention provides a method of manufacturing a semiconductor device including a non-volatile memory. The method of manufacturing comprises: making an element isolating region by forming a first trench in a semiconductor substrate between memory cell forming regions adjacent to each other along a gate width direction, and by filling the first trench with an isolating filler; making a floating gate electrode on the semiconductor substrate at the memory cell forming regions, the floating gate electrode having a predetermined a gate width; making a second trench in the isolating filler in the first trench and between floating electrodes adjacent to each other along a gate width direction, the second trench being narrow at bottoms thereof and providing a word line in the second trench, the word line extending along the gate width direction.

According to a final aspect of the embodiment of the invention, there is provided a method of manufacturing a semiconductor device including a non-volatile memory. The method of manufacturing comprises: making floating gate electrodes on a semiconductor substrate at memory cell forming regions, the floating gate electrode having a predetermined a gate width; making a first trench in the semiconductor substrate and between the floating gate electrodes adjacent to each other along a gate width direction, the first trench being in self-alignment to the floating gate electrode; making an element isolating region by filling an isolating filler in the first trench; making a side wall spacer on a surface of the isolating filler in a side wall of the floating gate electrodes, the side wall spacer being in self-alignment to said floating gate electrodes; making a second trench in the isolating filler filled in the first trench using the side wall spacer as a mask; and providing a word line in the second trench, the word line extending along the gate width direction.

DETAILED DESCRIPTION OF THE INVENTION

Figure 1:
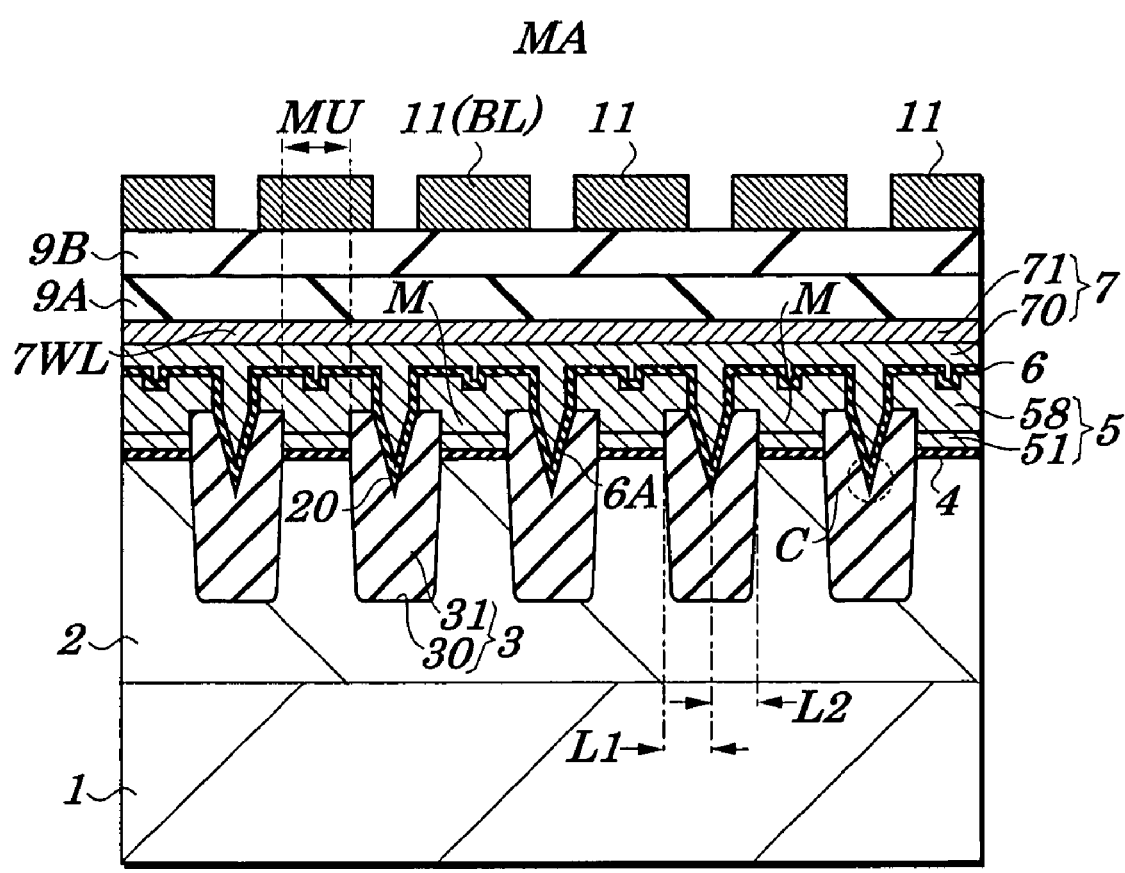
FIG. 1 is a cross section of an essential part of a semiconductor device including a non-volatile memory according to a first embodiment of the invention, taken along line F1-F1 in FIG. 3.

The invention will be described hereinafter with reference to embodiments shown in the drawings. Like or corresponding parts are denoted by like or corresponding reference numerals. It should be noted that the drawings are schematic and that dimensional relations between respective components shown therein sometimes differ from those of actual products. Further, different scales are sometimes employed in drawings.

First Embodiment of the Invention

Structure of Semiconductor Device Including Non-volatile Memory

This embodiment relates to a semiconductor device including a NAND type EEPROM. The term "semiconductor device" refers at least to a semiconductor device having only the NAND type EEPROM, and a semiconductor device including a logic circuit or the like as well as the NAND type EEPROM, all of which are mounted on one substrate.

Figure 2:
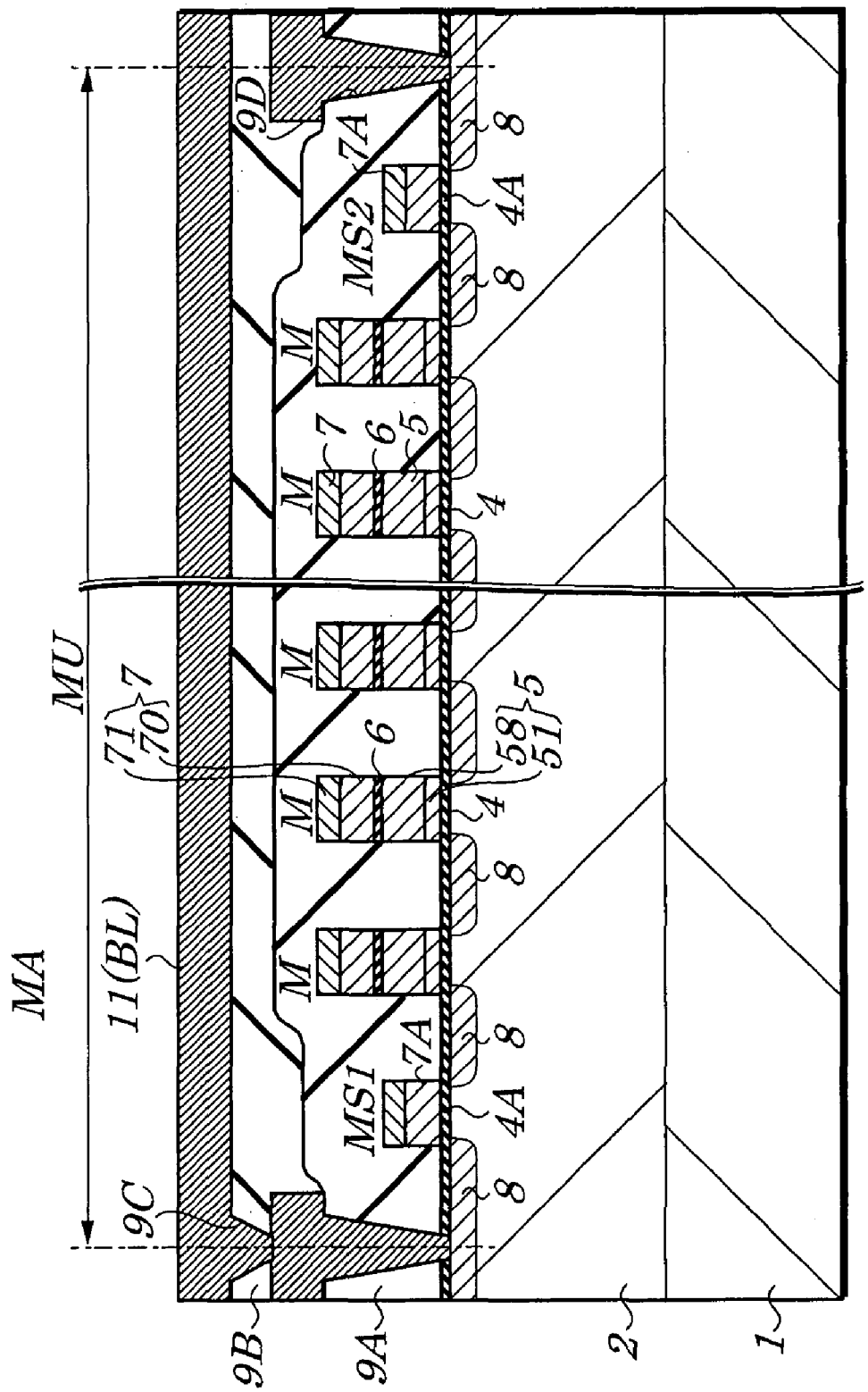
FIG. 2 is a cross section of the essential part of the semiconductor device, taken along line F2-F2 in FIG. 3.
Figure 3:
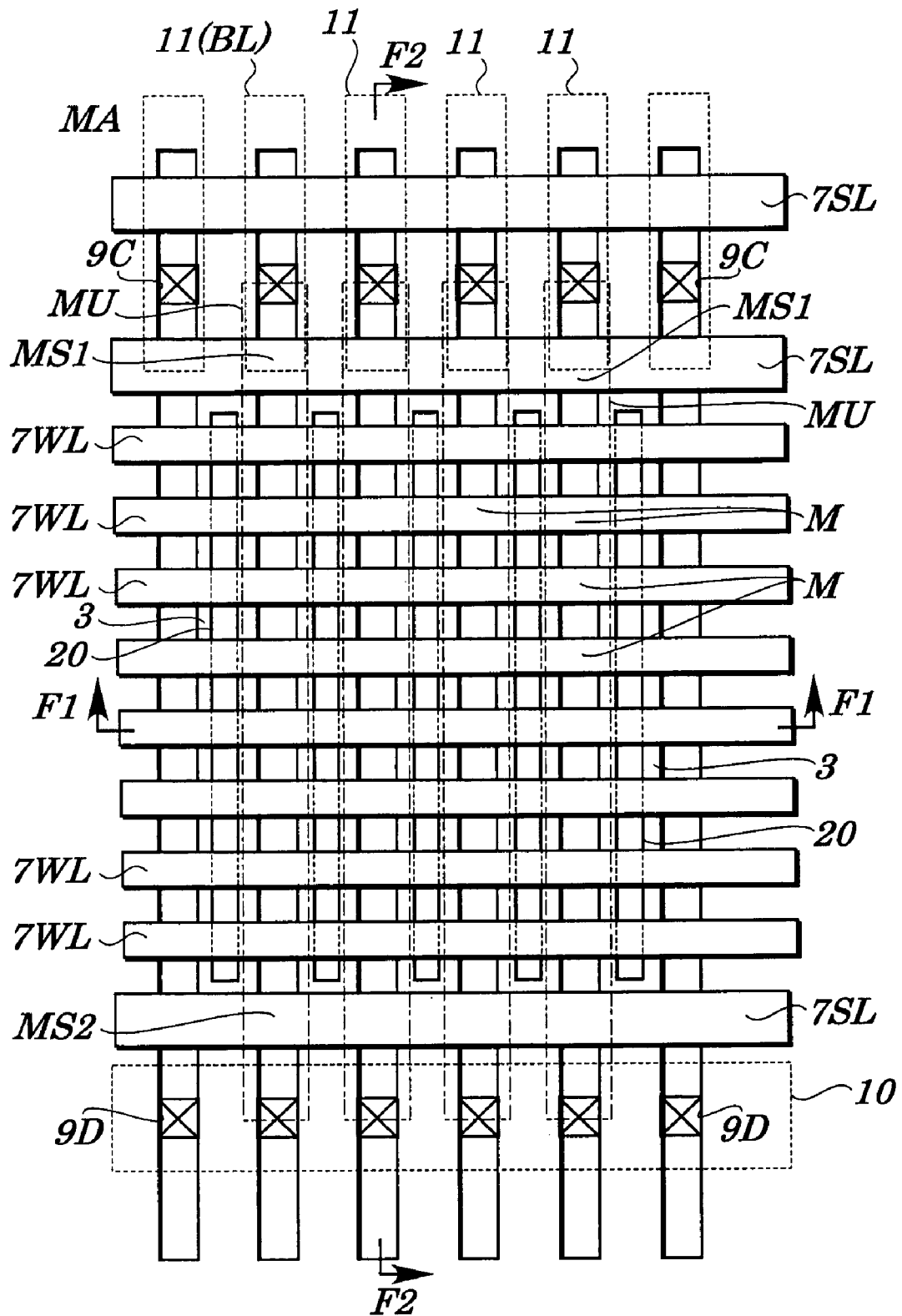
FIG. 3 is a top plan view of the essential part of the semiconductor device.

Referring to FIG. 1 to FIG. 3, the NAND type EEPROM includes: a memory cell array MA constituted by a plurality of memory cells M which have floating gate electrodes 5 and are arranged in the shape of a matrix on a semiconductor substrate 1 (or a well region 2); element isolating regions 3, each of which has a first trench 30 formed in the semiconductor substrate 1 (or the well region 2) and between memory cells M adjacent to each other along a gate width direction (i.e. along a word line), and an isolating filler 31 filled in the first trench 30; second trenches 20 formed in the isolating fillers 31 and between the floating gate electrodes 5 of the memory cells M, the second trenches 20 being narrow at the bottoms thereof; and word lines 7WL connected to memory cells M, buried in the second trenches 20, and extending along the gate width direction. The first trench 30 extends from a surface of the well region 2 (or a surface of the semiconductor substrate 1) toward a bottom of the well region 2 (or a bottom of the semiconductor substrate 1).

The semiconductor substrate 1 is preferably an n-type silicon single crystal substrate, for example. The well region 2 is a p-type well region, and is formed in the main surface of the semiconductor substrate 1 at least at an area for the memory cell array MA.

Each memory cell M is constituted by an one-transistor including the floating gate electrode 5, and stores one-bit data. A total of eight memory cells M are connected in series in order to constitute a memory cell unit MU storing one-byte data. Alternatively, the memory cell unit MU may be constituted by 16, 32, . . . memory cells M.

The memory cell M has a gate width regulating part surrounded by the element isolating region 3, and is electrically isolated from memory cells M adjacent to each other along the gate width direction and is formed in the well region 2 (semiconductor substrate 1). In other words, the memory cell M includes the well region 2 serving as a channel forming region, first gate insulating film 4, floating gate electrode 5 on the first gate insulating film 4, second gate insulating film 6 on the floating gate electrode 5, control gate electrode 7 on the second gate insulating film 6, and a pair of n-type semiconductor regions 8 functioning as source and drain regions.

The first gate insulating film 4 functions as a tunnel insulating film, and is preferably made of a silicon oxide film, a silicon nitride film or the like, or complex layers of the foregoing films.

The floating gate electrode 5 functions as a charge storing section, and is made of a silicon polycrystalline film, for example. The floating gate electrode 5 has its opposite ends overlapping on the element isolating region 3 in order to prevent misalignment which might occur during the manufacturing process.

The second gate insulating film 6 is preferably made of complex films including a silicon oxide film, silicon nitride film, and silicon oxide film which are stacked one over after another. These films (ONO dielectric films) have high dielectric constants and high withstand voltages, and are effective in writing and erasing data at a high voltage, and in reading data at a low voltage.

The control gate electrode 7 is preferably made of complex films including a refractory silicide film extending over a silicon polycrystalline film in order to assure stable manufacturing processes, low resistivity and so on. In this embodiment, the control gate electrode 7 is made of a polycide film including a tungsten silicide film covering a silicon polycrystalline film.

In the memory cell unit MU, a semiconductor region 8 functioning as a source region for memory cells M and a semiconductor region 8 functioning as a drain region for memory cells M adjacent along the gate length direction are integral, i.e. they are not separated by the element isolating region 3.

The control gate electrodes 7 of the transversely adjacent memory cells M are electrically connected, thereby forming word lines 7WL in the memory cell array MA. A plurality of word lines 7WL are provided along the gate length direction in accordance with a pitch of the memory cells M, and extend along the gate width direction, and are made of a material same as that of the control gate electrode 7. In other words, the word lines 7WL function as the control gate electrode 7 in the memory cells M.

A plurality of bit lines 11 are provided, along the gate width direction in accordance with a pitch of the memory cells M, on the word lines 7WL via inter-level isolating films 9A and 9B, and extend along the gate length direction. The bit lines 11 are connected to a unit selecting transistor MS1 via the connection holes 9D and 9C formed the inter-level isolating films 9A and 9B, and are electrically connected to a front tier of memory cells M in the memory cell unit MU via the unit selecting transistor MS1.

A rear tier of memory cells M are connected to a source line 10 via a unit selecting transistor MS2. The source line 10 extends on the inter-level isolating film 9A and along the gate width direction, and is connected to the unit selecting transistor MS2 via a connection hole 9D formed the inter-level isolating film 9A.

The source line 10 is made of a first wiring layer, e.g. an aluminum alloy film (Al—Si, Al—Cu, Al—Cu—Si or the like). The bit line 11 is made of a second wiring layer which is the same as that of the first wiring layer. Alternatively, the bit line 11 may be made of the first wiring layer while the source line 10 may be made of a semiconductor region (a diffusion layer).

The element isolating regions 3 have the STI structure. In the memory cell array MA, each element isolating region 3 determines a gate width of the memory cell M (transistor), and extends along the gate length direction, as shown in FIG. 1 and FIG. 3. The first trench 30 of the element isolating region 3 has a uniform diameter (trench width) in the well region 2, and is 0.13 µm to 0.16 µm thick and 0.20 µm to 0.25 µm deep from the surface of the well region 2. Alternatively, the first trench 30 may have other dimensional values.

The element isolating region 30 is filled with an isolating filler 31 which is preferably a silicon oxide film. Alternatively, the isolating filler 31 may be made of a silicon nitride film, or complex layers of a silicon oxide film and a silicon polycrystalline film.

Referring to FIG. 1, the second trench 20 in the element isolating region 30 is in the shape of V. In order to reduce the parasitic capacitance between the floating gate electrodes 5 of the memory cells M adjacent to each other along the gate width direction, the second trench 20 is shallower than the first trench 30, and is preferably reaches at least the surface of the well region 2. For instance, the second trench 20 is 0.05 µm to 0.08 µm thick and 0.08 µm to 0.10 µm deep from the top of the isolating filler 31. Further, a ratio of a top diameter with a bottom diameter of the second trench 20 is large compared with a ratio of a top diameter with a bottom diameter of the first trench 30.

As shown in FIG. 2 and FIG. 3, the unit selecting transistors MS1 and MS2 are constituted by the well region 2 serving as the channel forming region, gate insulating film 4A on the well region 2, gate electrode 7A on the gate insulating film 4A, and a pair of n-type semiconductor regions 8 functioning as source and drain regions. The gate electrode 7A is made of a conductive material same as that of the control gate electrode 7 of the memory cells M. A select line 7SL is made of a conductive material same as that of the word line 7WL, extends along the word line 7WL, and is electrically connected to the gate electrode 7A.

The second trench 20 is narrow at its bottom compared with at its top. The distances L1 and L2 between the bottom of the second trench 20 and the well region 2 can be increased as shown in FIG. 1. This is effective in improving insulation resistance between the word line 7WL in the second trench 20 and the well region 2. Further, it is possible to prevent electric short-circuiting between the word line 7WL and the well region 2 even if the second trench 20 is misaligned from the element isolating region 3 along the gate width direction.

Further, it is possible to increase the distances L1 and L2 at the bottom C of the second trench 20 where electric fields tend to concentrate, so that the word lines 7WL and the well region 2 are protected against electric short-circuiting.

The second trenches 20 in the NAND type EEPROM are effective in reducing the parasitic capacitance between memory cells M, preventing erroneous data writing and short-circuiting between the word line 7WL and the well region 2, and improving the electric reliability.

[Method of Manufacturing Semiconductor Device]

The semiconductor device with the NAND type EEPROM will be manufactured as described hereinafter with reference to FIG. 4 to FIG. 11.

(1) Making Well Region 2

Figure 4:
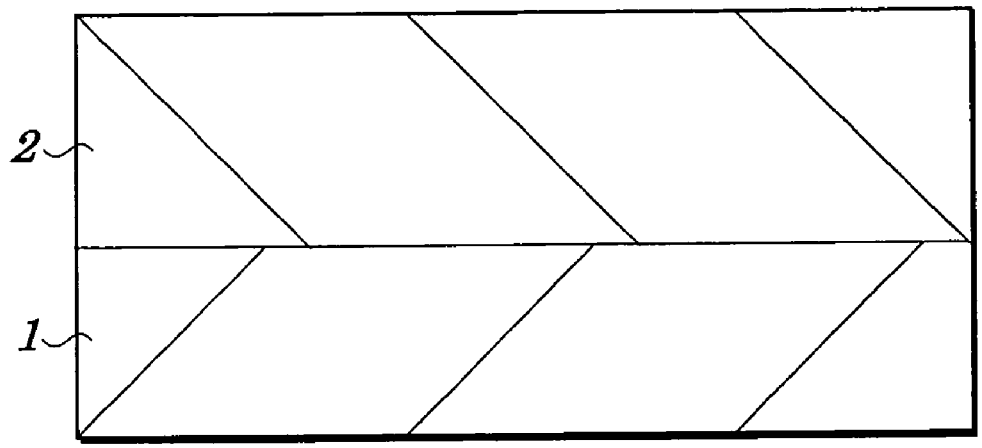
FIG. 4 is a cross section of the semiconductor device in a first manufacturing process of the first embodiment.

A semiconductor substrate 1 made of a silicon single crystal substrate is prepared first of all in order to make a well region 2 thereon as shown in FIG. 4.

(2) Making Element Isolating Region 3

Figure 5:
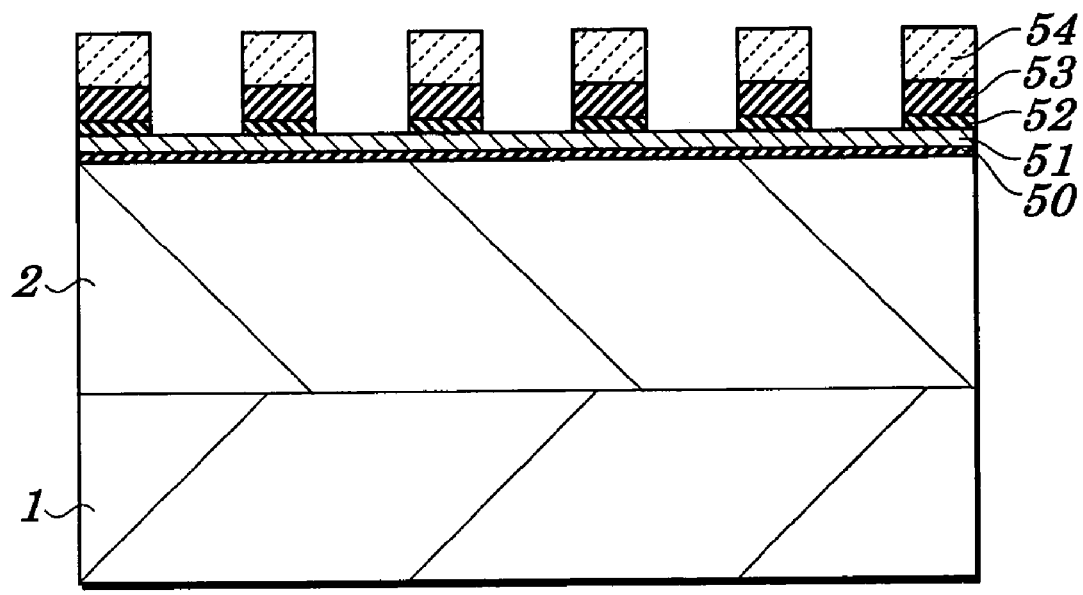
FIG. 5 is a cross section of the semiconductor device a second manufacturing process.

A 10 nm thick silicon oxide film 50, a 60 nm thick silicon polycrystalline film 51, a silicon nitride film 52 and a silicon oxide film 53 are formed on the well region 2 one over after another. The silicon oxide film 50 serves as the first gate insulating film 4. The silicon polycrystalline film 51 serves as a lower layer of the floating gate electrode 5. Thereafter, a photoresist mask 54 is formed on the uppermost silicon oxide film 53 by the photolithography. The photoresist mask 54 has an opening where the element isolating region 3 is formed. The silicon oxide film 53 and silicon nitride film 52 are patterned via the photoresist mask 54 by the reactive ion etching (RIE) process, as shown in FIG. 5.

Figure 6:
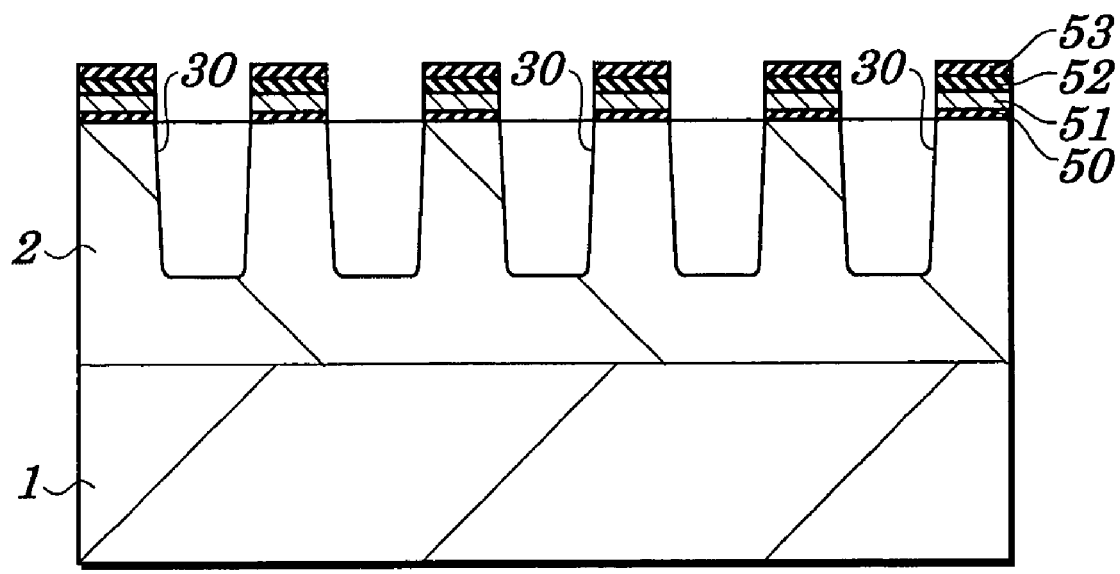
FIG. 6 is a cross section of the semiconductor device in a third manufacturing process.

The semiconductor substrate 1 is exposed in $O_2$ plasma in order to remove the photoresist mask 54. The exposed silicon oxide film 53 is used as an etching mask in order to pattern the silicon polycrystalline film 51 and silicon oxide film 50 one after another by the RIE. Further, the first trenches 30 are made in the well region 2 as shown in FIG. 6.

Figure 7:
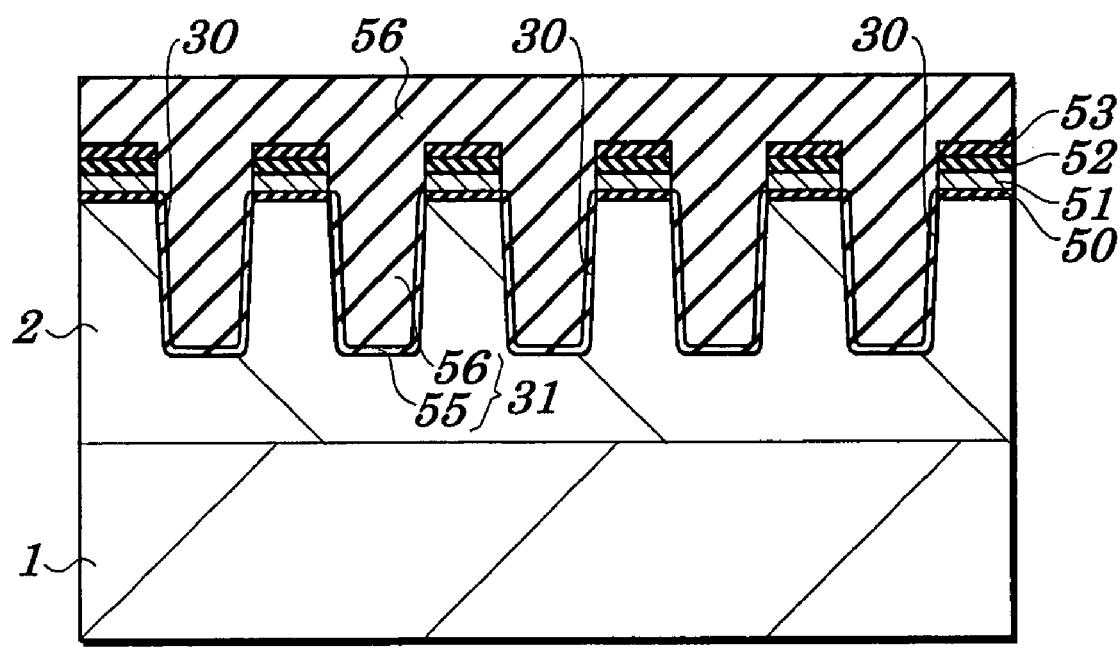
FIG. 7 is a cross section of the semiconductor device in a fourth manufacturing process.
Figure 8:
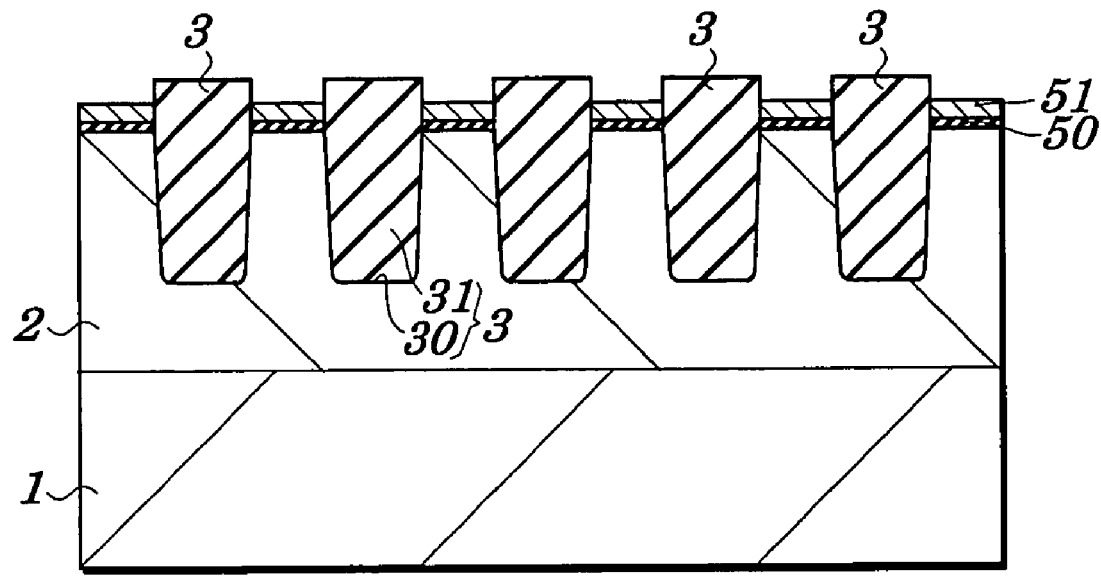
FIG. 8 is a cross section of the semiconductor device in a fifth manufacturing process.

The semiconductor substrate 1 is heated in an $O_2$ gas, thereby forming a 6 nm thick silicon oxide film 55 on the surfaces of the inner wall and bottoms of the first trenches 30. Then, a silicon oxide film 56 to be filled at least in the first trenches 30 is made by the high density plasma (HDP) process as shown in FIG. 7. The silicon oxide films 55 and 56 on the inner surface of the first trenches 30 are used as an isolating filler 31.

The silicon oxide film 56 has its surface polished and smoothened by the chemical mechanical polishing (CMP) process until it become substantially flush with the silicon nitride film 52. Next, the surface of the silicon oxide film 56 and the remaining silicon oxide film 53 are nitrified in a nitride gas. The semiconductor substrate 1 is immersed in an $NH_4F$ solution, and is treated by phosphoric acid at 150° C., thereby removing the silicon nitride film 52 and so on from the surface of the semiconductor substrate 1. In this state, the element isolating regions 3 are completed with the isolating fillers 31 (silicon oxide films 55 and 56) filled in the first trenches 30. See FIG. 8.

(3) First Step of Making Floating Gate Electrode 5

Figure 9:
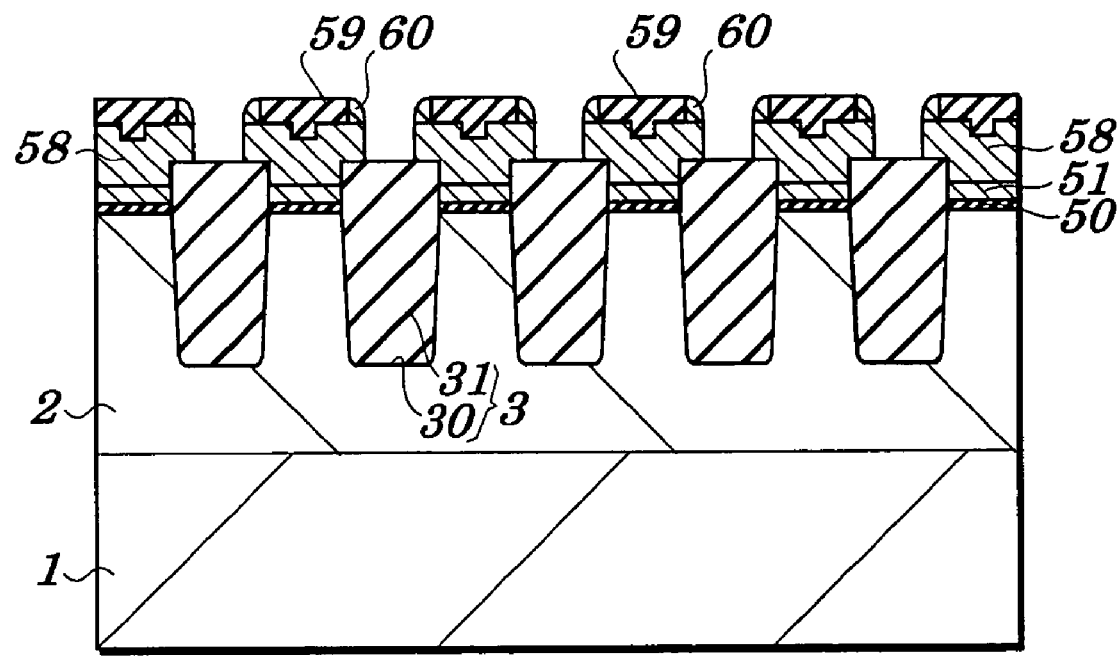
FIG. 9 is a cross section of the semiconductor device in a sixth manufacturing process.

A silicon polycrystalline 58 and a silicon oxide film 59, to which a phosphorous (P) is added as an n-type impurity by the low pressure CVD process, are deposited one over after another onto the semiconductor substrate 1, the silicon polycrystalline film 51 at the memory cell M forming region and the isolating fillers 31 in the element isolating regions 3 (see FIG. 9). A photoresist mask (not shown) having openings between the memory cells M adjacent to each other along the gate width direction are made by the photolithography. The silicon oxide film 59 is patterned by the RIE process using the photoresist mask. The semiconductor substrate 1 is exposed to the $O_2$ plasma, so that the photoresist mask is removed.

A silicon oxide film 60 is deposited by the low pressure CVD process onto the semiconductor substrate 1 including on the silicon oxide film 59, on inner walls of openings in the silicon oxide film 59 and on the silicon polycrystalline film 58 in openings of the silicon oxide film 59. The deposited silicon oxide film 60 is then etched, and is left only on the inner walls of openings in the silicon oxide films 59.

The silicon polycrystalline film 58 is patterned by the RIE process by using the silicon oxide film 59 and the remaining silicon oxide film 60 as an etching mask, as shown in FIG. 9. A size of the gate width of the floating gate electrodes 5 is determined by this patterning. The opposite ends of the silicon polycrystalline film 58 overlap on the element isolating regions 3 in order to compensate for misalignment caused in the manufacturing process.

(4) Making Second Trench 20

Figure 10:
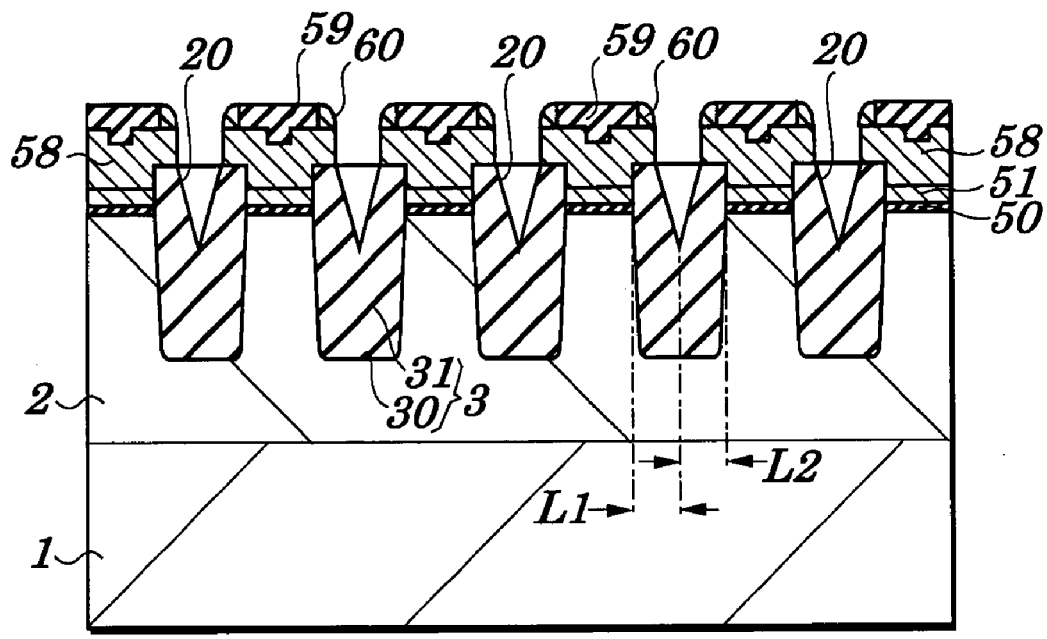
FIG. 10 is a cross section of the semiconductor device in a seventh manufacturing process.

Referring to FIG. 10, second trenches 20 are made in the isolating fillers 31 of the element isolating region 3 by the RIE process using the silicon oxide films 59 and 60 as an etching mask. The RIE process is carried out under the following conditions.

a. Etching period: 29 seconds
b. Etching pressure: 7.98 Pa
c. Etching power: 600 W
d. Flow rate of etching gas $C_4F_8/O_2/Ar$: 20 sccm/5 sccm/50 sccm
e. Temperatures at top, sides and bottom of etching chamber:
60° C./60° C./20° C.
f. Voltage applied to electrostatic chuck: 1.2 kV
g. Back helium pressure: 931 Pa/5320 Pa The second trenches 20 are self-aligned to an etching mask (the silicon oxide films 59 and 60), i.e. the floating gate electrodes 5, and are in the shape of V. Therefore, even if the second trenches 20 are misaligned from the element isolating regions 3 during the manufacturing process, the distances L1 and L2 can be reliably maintained between the inner walls of the second trenches 20 and the well region 2. This is because an inclination angle of the inner walls of the second trenches 20 is large compared with an inclination angle of the inner walls of the first trenches 30.

Further, the second trenches 20 are made using the etching mask (silicon oxide films 59 and 60) for forming the silicon polycrystalline film 58 (i.e. the floating gate electrode 5), so that the mask forming process is omitted, which is effective in reducing the number of manufacturing steps.

After making the second trenches 20, the semiconductor substrate 1 is immersed in a thin $NH_4F$ solution in order to remove the silicon oxide films 59 and 60.

(5) Making Second Gate Insulating Film 6.

A silicon oxide film, a silicon nitride film and a silicon oxide film are deposited one after another on the semiconductor substrate 1 including the silicon polycrystalline film 58. The low pressure CVD process is employed for this purpose. The semiconductor substrate 1 is then heated in an oxide gas, thereby obtaining the second gate insulating film 6 having the ONO structure. An insulating film 6A is formed on the inner surfaces of the second trenches 20 while they are being made.

(6) Second Step of Making Floating Gate Electrode 5, and Making Control Gate Electrode 7

A silicon polycrystalline film 70 is deposited at least not only on the semiconductor substrate 1 but also on the second gate insulating film 6 using the low pressure CVD process. Thereafter, a tungsten silicide film 71 is deposited on the silicon polycrystalline film 70 using the PVD process.

A 20 nm thick silicon oxide film (not shown) is formed on the tungsten silicide film 71. Thereafter, a photoresist mask (not shown) is provided on the silicon oxide film by the photolithography, and has a pattern at an area where the control gate electrodes 7 and word line 7WL are made. The silicon oxide film is patterned by the RIE process using the photoresist mask, thereby obtaining an etching mask 62 (shown in FIG. 11). The photoresist mask is finally removed.

Figure 11:
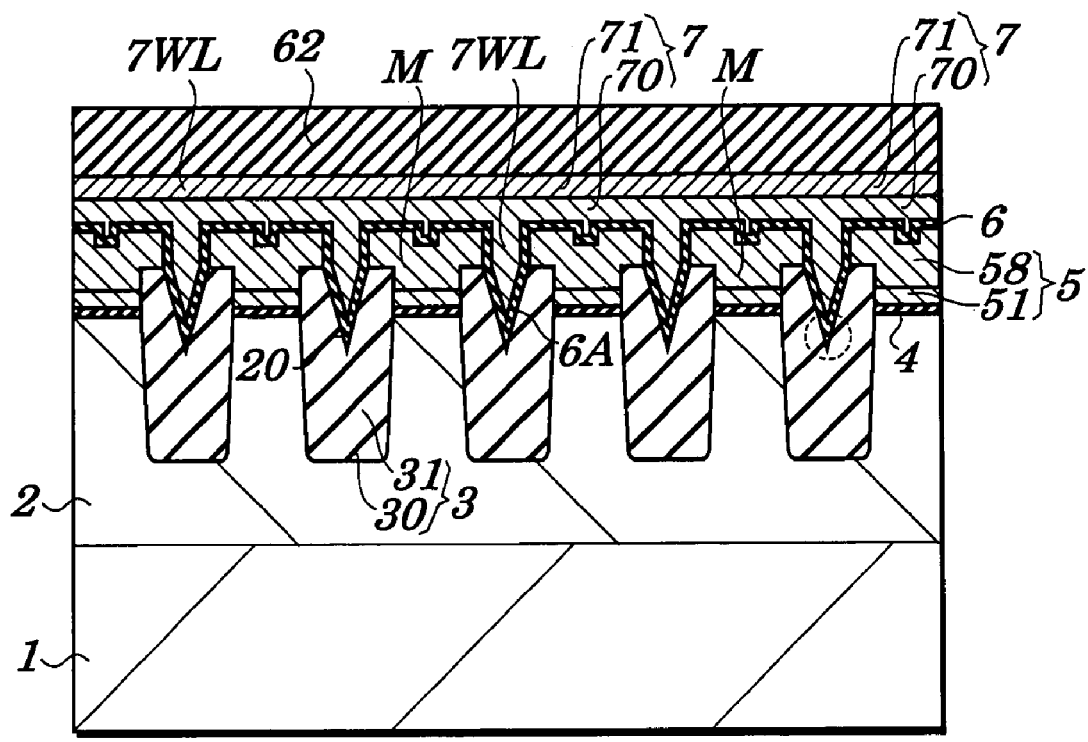
FIG. 11 is a cross section of the semiconductor device in an eighth manufacturing process.

The tungsten silicide film 71, silicon polycrystalline film 70, second gate insulating film 6 and silicon polycrystalline film 58 are patterned one after another using the etching mask 62. Referring to FIG. 11, the control gate electrode 7 and word line 7WL are made of the silicon polycrystalline film 70 and tungsten silicide film 71, and the floating gate electrode 5 is made of the silicon polycrystalline films 51 and 58. At least a part of the silicon polycrystalline film 70 of the word line 7WL is embedded in the second trenches 20 while the control gate electrodes 7 are being made.

(7) Making Source and Drain Regions

N-type impurities are implanted into the main surface of well region 2 by the ion implanting process by using the etching mask 62, thereby obtaining an n-type semiconductor region 8 which functions as source and drain regions (see FIG. 2). Thereafter, the etching mask 62 is removed.

The memory cells M will be completed when the semiconductor region 8 is made. The unit selecting transistors MS1 and MS2 are also made while the source and drains regions are being made.

(8) Making Source Lines 10 and Bit Lines 11

An inter-level isolation film 9A is made all over the semiconductor substrate 1 including the word line 7WL and the control gate electrode 7. Connection holes 9D are made in the inter-level isolation film 9A on the semiconductor region 8 serving as the source region for the unit selecting transistor MS2. The source lines 10 are made on the inter-level isolation film 9A in order to connect to the semiconductor region 8 via the connection hole 9D.

An inter-level isolation film 9B is provided on the semiconductor substrate 1 and source lines 10. A connection hole 9C is made in the inter-level isolation film 9B on the semiconductor region 8 serving as the drain region for the unit selecting transistor MS1. The bit lines 11 are made on the inter-level isolation film 9B in order to connect to the semiconductor region 8 via the connection holes 9C and 9D.

The foregoing steps complete the semiconductor device with the NAND type non-volatile memory.

In the first embodiment, the V-shaped second trenches 20 can be easily made when the processing conditions are appropriately selected. Further, even if the second trenches 20 are misaligned from the element isolating regions 3 during the manufacturing process, the distances L1 and L2 can be reliably maintained between the inner walls of the second trenches 20 and the well region 2.

Therefore, the first embodiment is effective in manufacturing the semiconductor device with the non-volatile memory with ease.

Second Embodiment of the Invention

In a second embodiment, a semiconductor device including a NAND type EEPROM has second trenches 21 whose shape differs from that of the second trenches 20 of the semiconductor device of the first embodiment.

Figure 12:
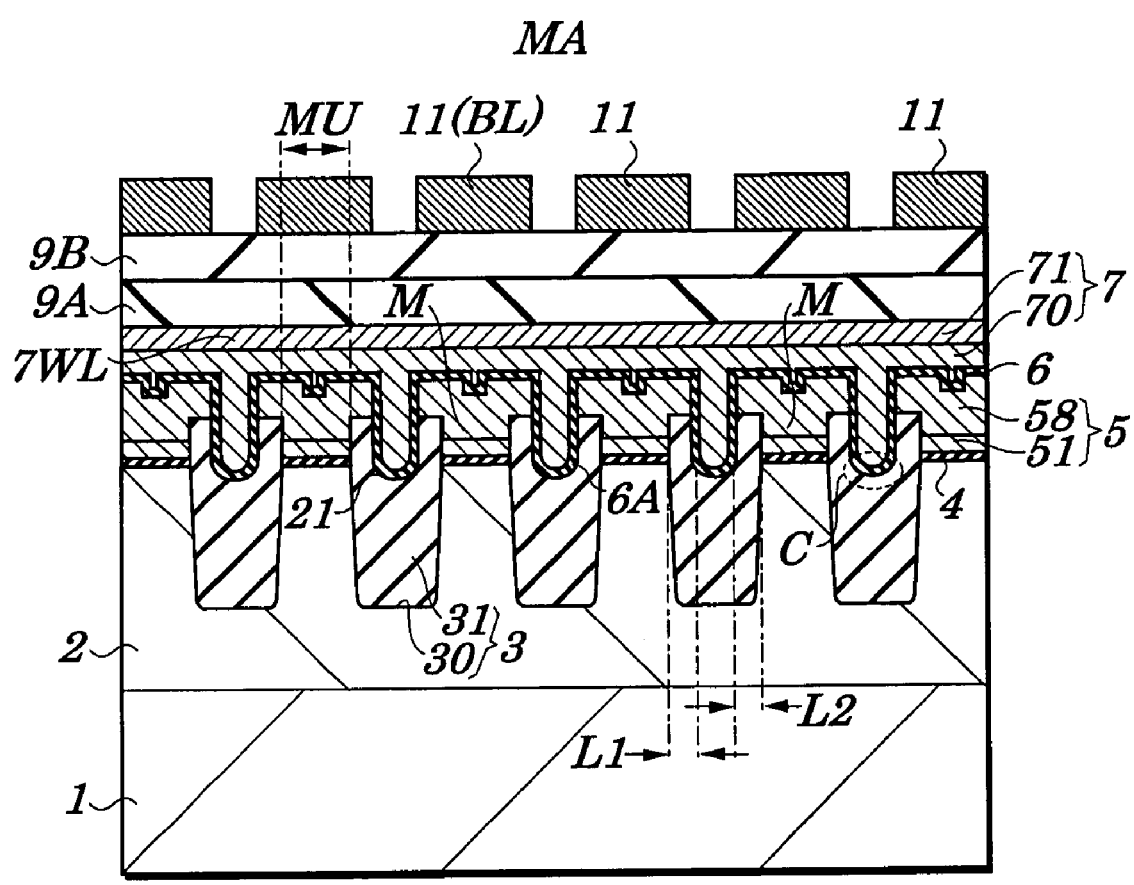
FIG. 12 is a cross section of an essential part of a semiconductor device including a non-volatile memory according to a second embodiment of the invention.

Referring to FIG. 12, the second trenches 21 in isolating fillers 31 are in the shape of U, and are thick at their tops and thin at their bottoms. Similarly to the second trenches 20 of the first embodiment, the second trenches 21 can assure sufficient distances L1 and L2 between their bottoms and well region 2, and improve insulation resistance between the word lines 7WL and the well region 2.

Since the bottoms of the second trenches 21 are curved, it is possible to prevent electric fields from gathering there, which is effective in improving the insulation resistance between the word lines 7WL and the well region 2.

The second trenches 21 are easily made substantially similarly to the second trenches 20 of the first embodiment, but by slightly changing the above-mentioned etching conditions and using both of the isotropic and anisotropic etching processes.

The semiconductor device of this embodiment is as effective and advantageous as the semiconductor device of the first embodiment.

Third Embodiment of the Invention

In a third embodiment, a semiconductor device including a NAND type EEPROM has second trenches 22 whose shape differs from that of the second trenches 20 of the first embodiment.

Figure 13:
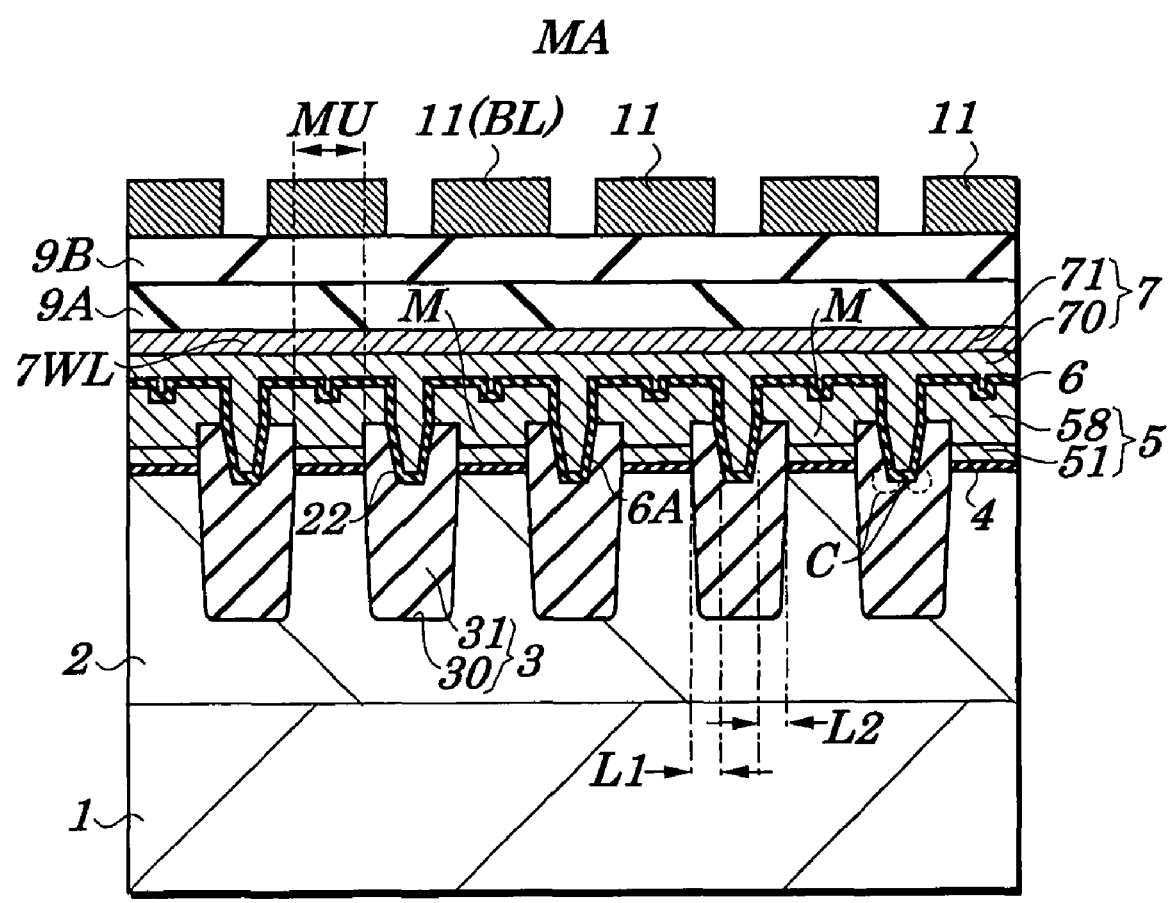
FIG. 13 is a cross section of an essential part of a semiconductor device including a non-volatile memory according to a third embodiment of the invention.

As shown in FIG. 13, the second trenches 22 are in the shape of an inverted trapezoid, and are made in isolating fillers 31. The second trenches 22 are thick at their tops and thin at their bottoms. Therefore, sufficient distances L1 and L2 can be maintained between the bottoms of the second trenches 22 and the well region 2. This is effective in improving insulation resistance between word lines 7WL and well region 2.

Further, since an angle formed by a side wall and a bottom of each second trench 22 is larger than 90 degrees, it is possible to prevent electric fields from gathering. This is effective in improving the insulation resistance between the word lines 7WL and the well region 2.

The second trenches 22 can be easily made by slightly changing the etching conditions for the second trenches 20 of the first embodiment, more particularly by slightly increasing an amount of side etching.

The semiconductor device of this embodiment is as effective and advantageous as the semiconductor device of the first embodiment.

Fourth Embodiment of the Invention

This embodiment relates to a method of manufacturing a semiconductor device with a NAND type non-volatile memory in which second trenches are self-aligned to first trenches 30 in element isolating regions 3.

[Method of Manufacturing Semiconductor Device]

The semiconductor device will be manufactured as described hereinafter with reference to FIG. 14 to FIG. 20.

(1) Making Well Region 2

A semiconductor substrate 1 made of a silicon single crystal substrate is prepared first of all. A well region 2 is formed in a surface of the semiconductor substrate 1 in the manner similar to that for the semiconductor device as shown in FIG. 4.

(2) First Step of Making Floating Electrode 5

A 10 nm thick silicon oxide film 50, a 150 nm thick silicon polycrystalline film 51, a silicon nitride film 52 and a silicon oxide film 53 are formed on the well region 2 one over after another. The silicon oxide film 50 serves as the first gate insulating film 4. The silicon polycrystalline film 51 serves as a lower layer of the floating gate electrode 5. A target thickness of the floating gate electrode 5 depends upon thickness of the silicon polycrystalline film 51.

Figure 14:
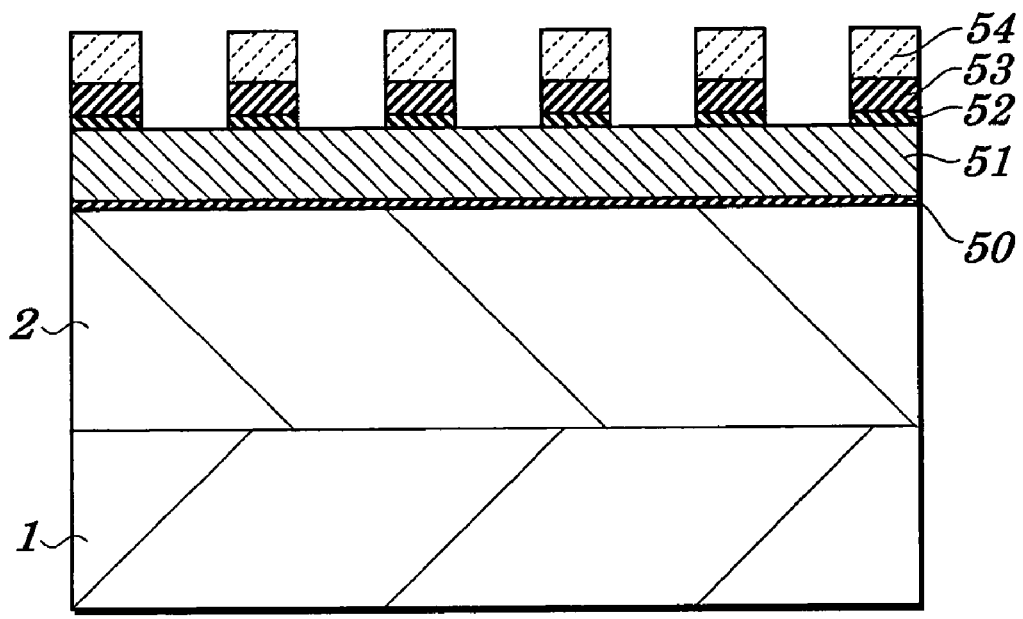
FIG. 14 is a cross section of a semiconductor device including a non-volatile memory according to a fourth embodiment of the invention and being in a first manufacturing process.

Thereafter, a photoresist mask 54 is formed on the uppermost silicon oxide film 53 by the photolithography. The photoresist mask 54 has an opening where the element isolating region 3 is formed. The silicon oxide film 53 and silicon nitride film 52 are patterned using the photoresist mask 54 by the RIE process, as shown in FIG. 14.

Figure 15:
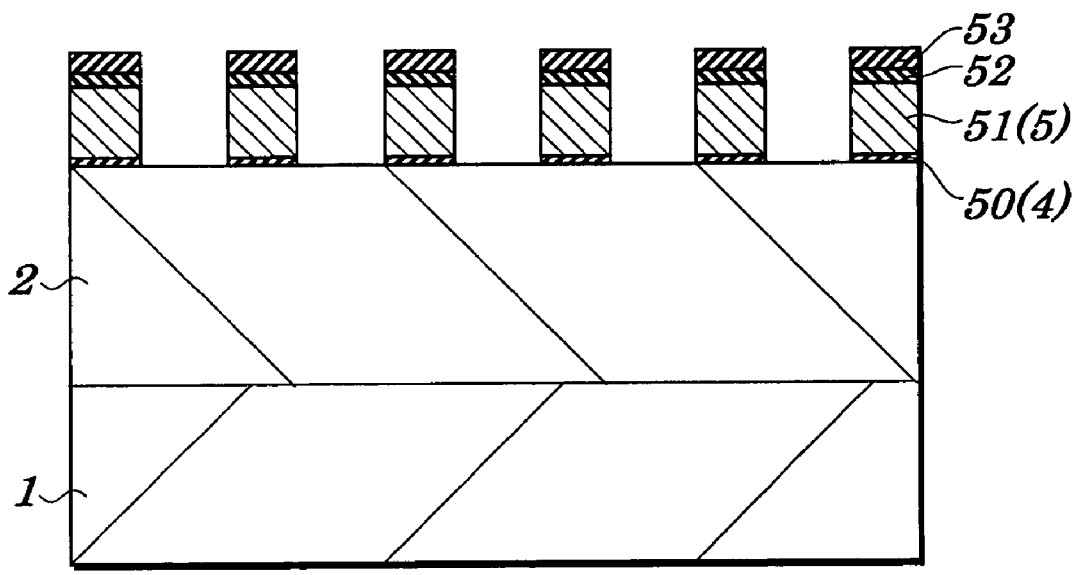
FIG. 15 is a cross section of the semiconductor device in a second manufacturing process.

The semiconductor substrate 1 is exposed in $O_2$ plasma in order to remove the photoresist mask 54. The exposed silicon oxide film 53 is used as an etching mask in order to pattern the silicon polycrystalline film 51 and silicon oxide film 50 one after another by the RIE process as shown in FIG. 15. A gate width of the floating gate electrode 5 depends upon the silicon polycrystalline film 51.

(3) Making Element Isolating Region 3

Figure 16:
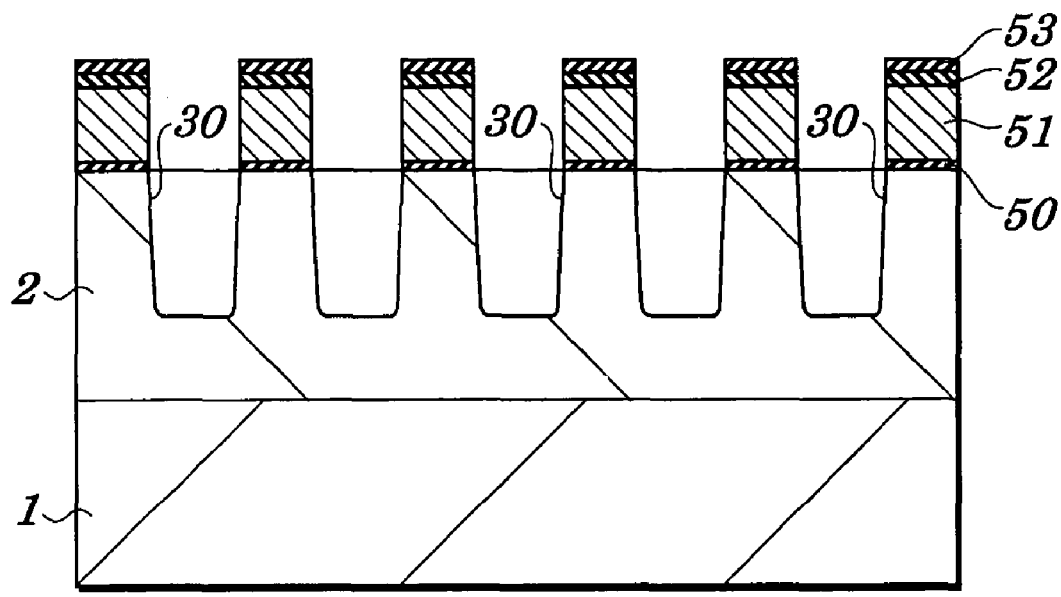
FIG. 16 is a cross section of the semiconductor device in a third manufacturing process.

First trenches 30 are made in the well region 2 by the RIE processing using the silicon oxide film 53 as an etching mask as shown in FIG. 16. The first trenches 30 are made of the etching mask of the material same as that of the floating gate electrodes 5 (silicon polycrystalline film 51), and are self-aligned to the floating gate electrodes 5.

Figure 17:
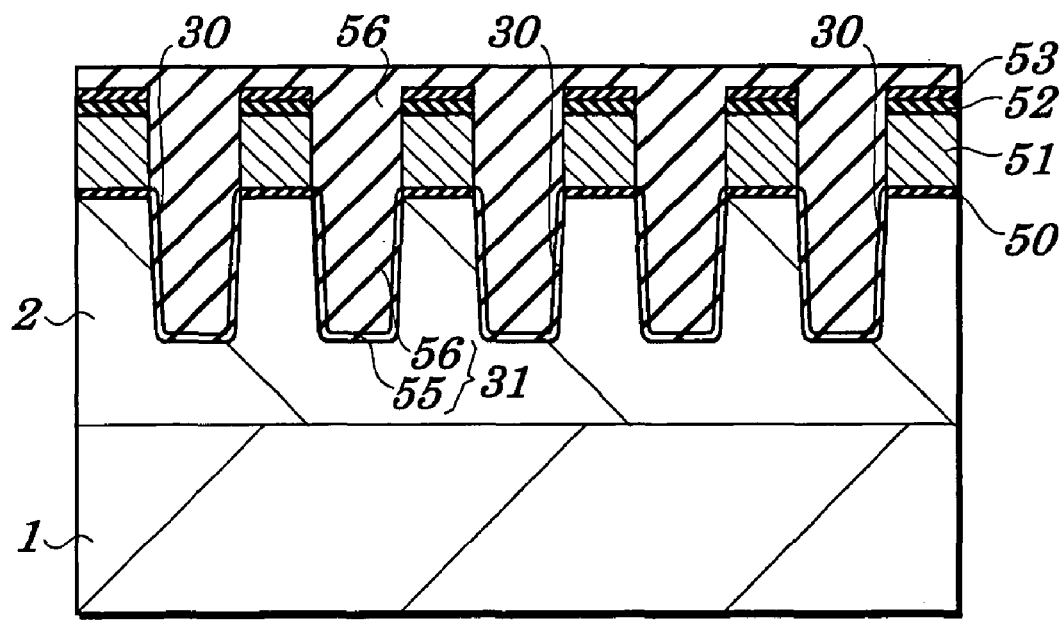
FIG. 17 is a cross section of the semiconductor device in a fourth manufacturing process.

The semiconductor substrate 1 is heated in an $O_2$ gas in order to form a 6 nm thick silicon oxide film 55 on inner walls and bottoms of the first trenches 30. Referring to FIG. 17, a silicon oxide film 56 is deposited in order to fill at least the first trenches 30. The silicon oxide films 55 and 56 in the first trenches 30 serves as isolating fillers 31.

Figure 18:
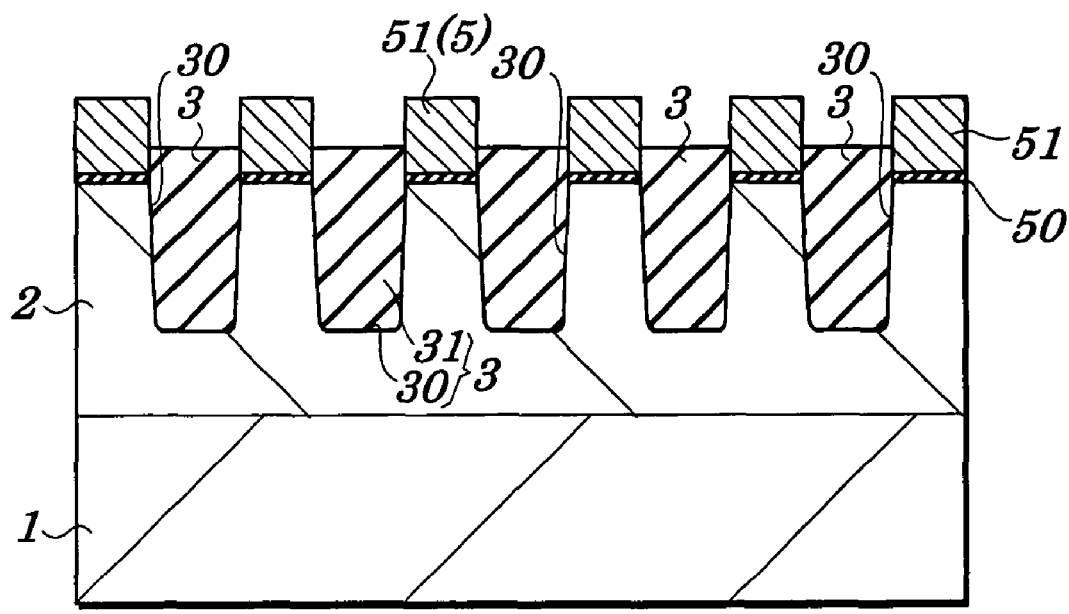
FIG. 18 is a cross section of the semiconductor device in a fifth manufacturing process.

The top surface of the silicon oxide film 56 is smoothened by the CMP process until it substantially reaches the silicon nitride film 52. Thereafter, the semiconductor substrate 1 is heated in a nitride gas, thereby making the isolating fillers 31 thick. The isolating fillers 31 have their tops removed by the RIE process or by using an $NH_4F$ solution. In this case, the silicon nitride film 52 is used as an etching mask. As a result, the isolating fillers 31 are 0.03 µm to 0.05 µm tall from the well region 2, and are below the surface of the silicon polycrystalline film 51. Then, the semiconductor substrate 1 is treated using phosphoric acid at 150° C., so that the silicon nitride film 52 is completely removed from the semiconductor substrate 1 as shown in FIG. 18. In this state, the element isolating region 3 is substantially completed once the first trenches 30 are self-aligned to the floating gate electrodes 5 and the isolating fillers 31 are self-aligned to the floating gate electrode 5 in the first trenches 30.

(4) Making Second Trench 23

A silicon oxide film 59 is deposited by the CVD process on all over the semiconductor substrate 1 including the silicon polycrystalline film 51 and isolating fillers 31 of the element isolating region 3. Specifically, on the top and sides of the silicon polycrystalline film 51 and on the isolating fillers 31, the silicon oxide film 59 of uniform film thickness is formed, and the thickness of the silicone oxide film 59 between floating gate electrodes 5 (silicon polycrystalline film 51) adjacent to each other along the gate width direction does not thicken in comparison with formed thickness.

Figure 19:
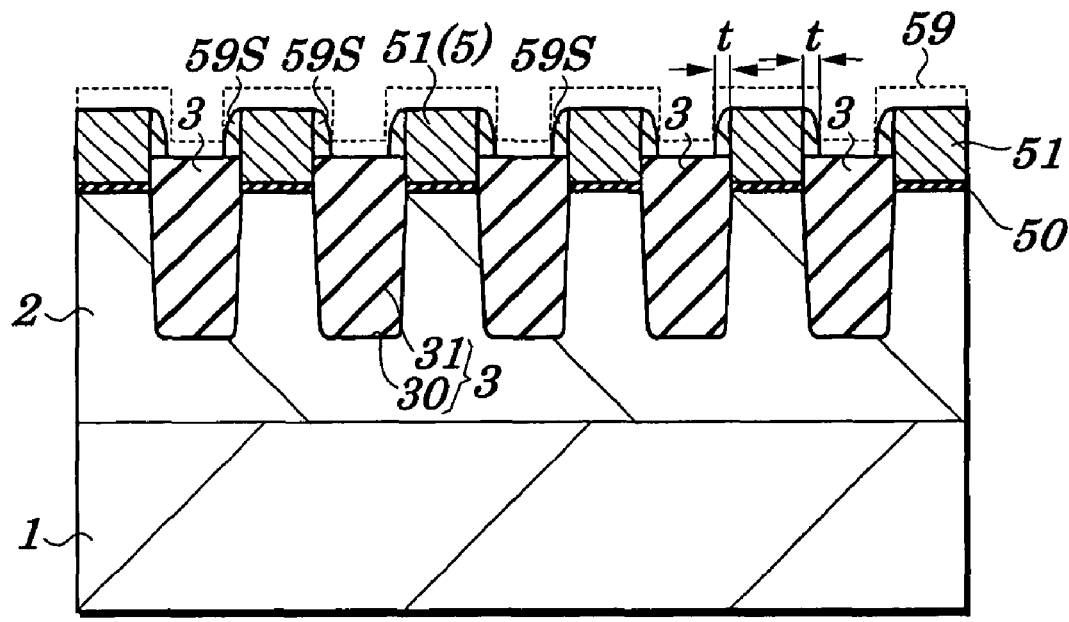
FIG. 19 is a cross section of the semiconductor device in a sixth manufacturing process.

The silicon oxide film 59 is at least partially removed by the anisotropic etching such as the RIE process, thereby forming side wall spacers 59S on sides of the floating gate electrodes 5 as shown in FIG. 19. The side wall spacers 59S are self-aligned to the floating gate electrodes 5 and the first trenches 30 of the element isolating region 3, and have a thickness "t" which substantially depends upon the thickness of the silicon oxide film 59, and is precisely controlled.

Figure 20:
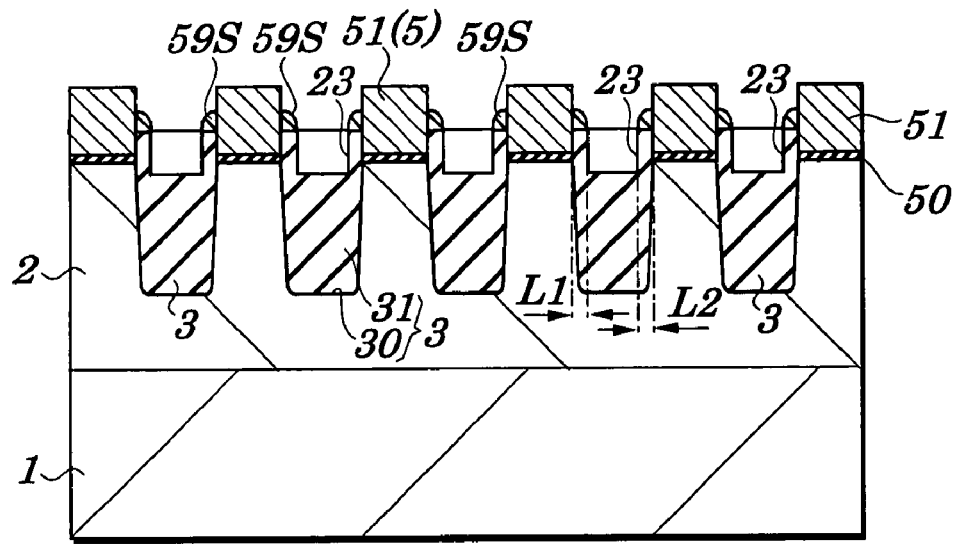
FIG. 20 is a cross section of the semiconductor device in a seventh manufacturing process.
Figure 21:
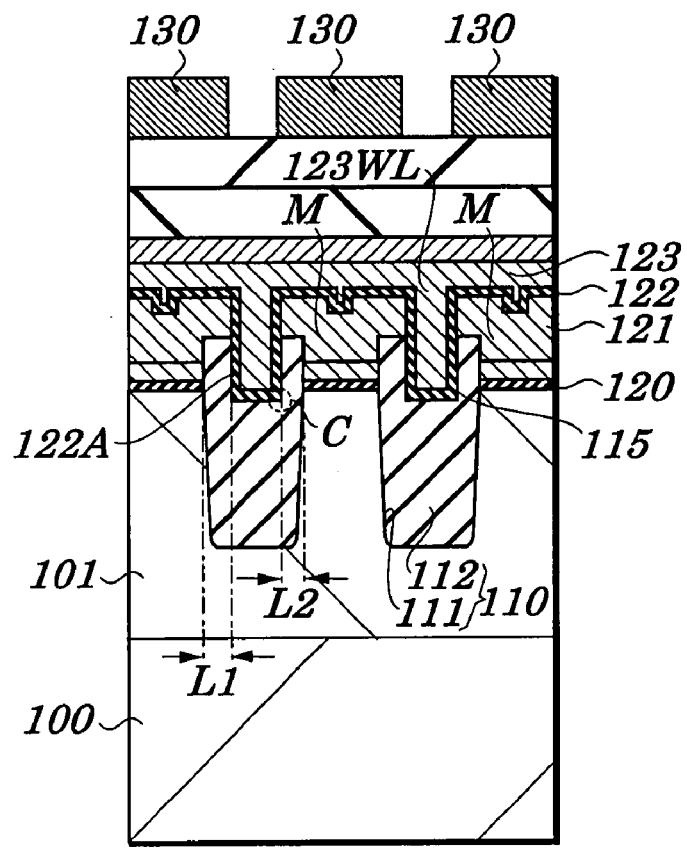
FIG. 21 is a cross section of an essential part of a NAND type EEPROM of the related art.

Thereafter, second trenches 23 are made in the isolating fillers 31 by the RIE process using the side wall spacers 59S and floating gate electrodes 5 as an etching mask as shown in FIG. 20. The trenches 23 have bottoms thereof being flush with or under the surface of the well region 2, and are self-aligned to the side wall spacers 59S, floating gate electrodes 5 and the first trenches 30.

According to the fourth embodiment, both of the first trenches 30 and the second trenches 23 are self-aligned to the floating gate electrodes 5, so that the distances L1 and L2 between the side walls of the first trenches 30 and the second trenches 23 can be reliably maintained even if misalignment occurs during the manufacturing process. The second trenches 23 of this embodiment have the shape different from those of the second trenches 20 to 22 of the first to third embodiments, and the distances L1 and L2 which remain invariable, so that the semiconductor device can reliably maintain the target insulation resistance.

Further, the floating gate electrodes 5 and the first trenches 30 and the second trenches 23 are made using the same mask (i.e. the silicon oxide film 52), which is effective in reducing the number of masks to be used and the number of the manufacturing steps.

With the fourth embodiment, the semiconductor substrate 1 is immersed in the $NH_4F$ solution after the formation of the second trenches 23, thereby removing the side wall spacers 59S.

(5) Making Second Gate Insulating Film 6 and Other Components

Processes for making a second gate insulating film 6 and other components are the same as those mentioned with respect to the first embodiment, and will not be described here.

Other Embodiment of the Invention

The embodiments of the invention has been described with respect to semiconductor devices having the NAND type non-volatile memory. Alternatively, the semiconductor devices can include a NOR type non-volatile memory.

Further, the embodiments of the invention is also applicable to semiconductor devices including memory cells with a two-transistor structure.

Still further, it is possible to use the semiconductor devices of the first to third embodiments in combination with the semiconductor device of the fourth embodiment. In other words, the second trenches may be self aligned to the floating gate electrodes and the first trenches, and may be V-shaped or U-shaped or have the shape of an inverted trapezoid.

Although the embodiments of the invention has been described with respect to some embodiments thereof, it will be understood by those skilled in the art that various modifications are possible without departing from the spirit of the present invention.

The embodiments of the invention provide a electrically reliable semiconductor device which includes a non-volatile memory in order to prevent electric short-circuiting between a word line and a semiconductor substrate.

Further, the invention provides a method of manufacturing the foregoing semiconductor device including a non-volatile memory.

What is claimed is:

1. A semiconductor memory, comprising:
  a memory cell array constituted by memory cells, each memory cell having a floating electrode, the memory cells being arranged in a matrix on a semiconductor substrate;
  a plurality of first trenches formed in said semiconductor substrate, each first trench being formed between adjacent ones of said memory cells along a gate width direction;
  a plurality of isolating fillers filled in said first trenches;
  a plurality of second trenches formed in said isolating fillers, each second trench being formed between said floating electrodes of adjacent ones of said memory cells along the gate width direction, and said second trenches being in the shape of a U, wherein a width of the second trenches at a first point above a second point is always at least equal to a width of the second trenches at the second point; and
  a word line connected to said memory cells, buried in said second trenches and extending along the gate width direction.

2. The semiconductor memory of claim 1, wherein each of said second trenches is shallower than said first trenches and extends below a surface of said semiconductor substrate.

3. The semiconductor memory of claim 1, wherein said memory is at least one of a NAND and NOR type electrically erasable programmable read only memory.

4. The semiconductor memory of claim 1, wherein each of said second trenches has a second gate insulating film on inner surfaces thereof.

5. The semiconductor memory of claim 1, wherein each of said second trenches is capable of reducing parasitic capacitance between said floating electrodes of said memory cells adjacent to each other along the gate width direction.

6. The semiconductor memory of claim 1, further comprising a gate insulating film in said second trenches, wherein said word line is on the gate insulating film.

7. The semiconductor memory of claim 6, wherein said gate insulating film includes at least a silicon nitride film.

8. A method of manufacturing a semiconductor memory, comprising:
  making element isolating regions by forming a plurality of first trenches in a semiconductor substrate, each first trench being made between adjacent ones of a plurality of memory cell forming regions along a gate width direction;
  filling said plurality of first trenches with a plurality of isolating fillers;
  making a plurality of floating gate electrodes on said semiconductor substrate at said memory cell forming regions, said floating gate electrodes having a predetermined gate width;
  making a plurality of second trenches in said isolating fillers filled in said first trenches, each second trench being made between adjacent ones of the floating electrodes along the gate width direction, said second trench being in the shape of a U, wherein a width of the second trenches at a first point above a second point is always at least equal to a width of the second trenches at the second point; and
  forming a word line in said second trenches, said word line extending along the gate width direction.

9. The method of claim 8, wherein said second trenches are in self-alignment to said floating electrodes.

10. The method of claim 8, wherein each of said second trenches has a second gate insulating film on inner surfaces thereof.

* * * * *